(12) United States Patent
Gerrits

(10) Patent No.: US 6,704,554 B1
(45) Date of Patent: Mar. 9, 2004

(54) FREQUENCY MODULATION RECEIVER IN PARTICULAR FOR AN RDS APPLICATION

(75) Inventor: John F. M. Gerrits, Cortaillod (CH)

(73) Assignee: Conseils et Manufactures VLG SA (CH)

( * ) Notice: Subject to any disclaimer, the term of this patent is extended or adjusted under 35 U.S.C. 154(b) by 527 days.

(21) Appl. No.: 09/665,401

(22) Filed: Sep. 20, 2000

(30) Foreign Application Priority Data

Oct. 6, 1999 (CH) ............................................. 1829/99

(51) Int. Cl.[7] ................................................. H04B 1/16
(52) U.S. Cl. ................. 455/205; 455/180.3; 455/182.2; 455/192.2; 455/208; 455/260; 375/344
(58) Field of Search ................................ 455/205, 208, 455/209, 192.1, 192.2, 255–260, 264, 313, 318, 323, 179.1, 180.1, 180.2, 180.3, 182.1, 182.2; 375/344

(56) References Cited

U.S. PATENT DOCUMENTS

| 4,092,602 A | * | 5/1978 | Nishioka et al. ................ 381/3 |
| 4,426,735 A | | 1/1984 | Kasperkovitz |
| 4,523,328 A | | 6/1985 | Kasperkovitz |
| 4,569,085 A | | 2/1986 | Nolde et al. |
| 4,607,392 A | | 8/1986 | Nolde et al. |
| 4,607,393 A | * | 8/1986 | Nolde et al. ................ 455/208 |
| 4,658,423 A | | 4/1987 | Nolde |
| 4,669,119 A | | 5/1987 | Jansen et al. |

* cited by examiner

Primary Examiner—Quochien B. Vuong
(74) Attorney, Agent, or Firm—Richard K. Robinson

(57) ABSTRACT

There is described an FM receiver (29) including; an antenna (2) able to receive a high frequency signal from a transmitter; a high frequency stage (3); an oscillator (5); a mixer unit (30) able to provide a signal (S6) at an intermediate frequency ($f_{IF}$); an FM demodulation stage (8); and an automatic frequency control stage (36) able to control the oscillator, so as to keep said intermediate frequency ($f_{IF}$) of said signal (S6) constant. This receiver further includes a locked loop (32) arranged to enslave said intermediate frequency ($f_{IF}$) from a pilot frequency (fp) present in the demodulated signal. One advantage of such a locked loop is that the intermediate frequency is enslaved so that the aliasing phenomenon does not prevent demodulation of the signals containing the RDS data.

8 Claims, 5 Drawing Sheets

FREQUENCY MODULATION RECEIVER IN PARTICULAR FOR AN RDS APPLICATION

The present invention concerns the field of frequency modulation receivers (hereinafter "FM receivers") able to receive a signal at a high frequency from a transmitter, particularly for a Radio Data System (RDS) application.

With reference to FIG. 1 of the present description, French Patent No. 2705,176 discloses a conventional FM receiver 1 which includes an antenna 2, a high frequency stage (RF) 3, a mixer 4, a local oscillator 5, an intermediate frequency (IF) filter 6, an amplifier/limiter 7, an FM demodulation stage 8 and an automatic frequency control (AFC) stage 9.

Antenna 2 receives a signal having a frequency comprised within the FM transmission band (i.e. between 88 and 108 MHz), and supplies the corresponding electric signal to RF stage 3.

RF stage 3 is tuned onto the carrier frequency fc of a predetermined transmitter so as to provide, in response to the electric signal originating from the antenna, an amplified signal having a frequency comprised within a frequency band centred on frequency fc.

Mixer 4 receives the signal originating from RF stage 3, as well as a signal originating from local oscillator 5, multiplies these signals, and supplies to IF filter 6 a signal modulated at an intermediate frequency $f_{IF}$, the latter being generally chosen to be equal to approximately 70 kHz.

IF filter 6 is arranged to receive the signal modulated at frequency $f_{IF}$ and, in response to provide a signal located within a frequency band centred around intermediate frequency $F_{IF}$.

Amplifier/limiter 7 receives the signal originating from IF filter 6, limits its amplitude to eliminate any amplitude modulation (AM) component and, in response, provides this amplified/limited signal.

FM demodulation stage 8 demodulates the signal originating from amplifier/limiter 7, and provides the demodulated signal to an audio amplifier (not shown in FIG. 1).

AFC stage 9 allows fine tuning to be performed between frequency $f_{LO}$ of the signal from local oscillator 5 as a function of the continuous output of demodulator 8 in order to keep intermediate frequency $f_{IF}$ constant.

One problem of an FM radio receiver such as that shown in FIG. 1 consists in the fact that considerable distortion can appear by aliasing, when the modulation frequency (i.e. that of the message signal) is greater than half of intermediate frequency $f_{IF}$.

The problem of aliasing distortion arises particularly in transmission systems using frequency division multiplexing, as is the case in Europe with FM broadcasting, in particular for an RDS application. Indeed, the effect of such distortion can be that decoding the RDS data becomes impossible.

FIG. 2 of the present description shows the frequency spectral distribution of the signals present in FM receiver 1, during an RDS application. Audio data are modulated in stereophony on a sub-carrier of 38 kHz, while other data corresponding to the RDS data are present in the form of low amplitude signals modulated on a sub-carrier of 57 kHz by phase shift (PSK modulation). In order to allow the RDS data to be decoded, and with reference once more to FIG. 1, the output bandwidth of FM demodulation stage 8 would have to be at least 60 kHz. Indeed, assuming that the intermediate frequency $f_{IF}$ used is of the order of 70 kHz, the audio data and the RDS data can be mixed by aliasing.

A first conventional solution to the problem of frequency aliasing consists in using a higher frequency $f_{IF}$. U.S. Pat. No. 4,885,802 discloses an FM receiver implementing such a solution.

One drawback of such an FM receiver lies in the fact that it requires the use of additional means to filter the response of the image frequency of the RF signal, which also increases the electric power consumption.

Another drawback of such an FM receiver lies in the fact that the maximum intermediate frequency which can be used is imposed by the image frequency rejection and by the spacing of the channels or transmitters in the FM broadcasting band. Consequently, the audio bandwidth of the demodulated signals cannot thus simply be improved by increasing intermediate frequency $f_{IF}$ of the FM receiver.

A second conventional solution to the problem of frequency aliasing consists in providing a signal having a higher frequency than intermediate frequency $f_{IF}$ to the demodulation stage.

With reference to FIG. 3 of the present description, U.S. Pat. No. 5,483,695 discloses an FM receiver implementing such a solution. It will be noted in FIG. 3 that similar objects to those in FIG. 1 have been designated by the same references. FM receiver 20 further includes a signal generator circuit 24 able to generate n signals at intermediate frequency $f_{IF}$, and a multiplier circuit 28 able to multiplier between them the n signals to provide a signal modulated at a frequency equal to n times intermediate frequency $f_{IF}$.

One drawback of FM receiver 20 lies in the fact that it is necessary to generate signals in phase quadrature and having a frequency equal to intermediate frequency $f_{IF}$, which considerably increases the electric power consumption.

One object of the present invention is to provide an FM radio receiver for an RDS application which overcomes the aliasing problem, in particular an FM radio receiver able to extract the RDS data present in a radio-frequency signal received by said receiver.

Another object of the present invention is to provide an FM radio receiver answering the usual criteria in the semiconductor industry as to low electric power consumption.

Another object of the present invention is to provide an FM radio receiver in the form of an integrated circuit answering the usual criteria in the semiconductor industry as to rationality and surface occupation.

These objects, in addition to others, are achieved by the FM receiver according to claim 1.

One advantage of the arrangement of the locked loop of such a receiver is that intermediate frequency $f_{IF}$ is enslaved to a predetermined value so that the aliasing phenomenon does not prevent decoding of the RDS data present in a radio-frequency signal received by the receiver.

Another advantage of such an arrangement is that the receiver may operate with low intermediate frequencies $f_{IF}$, without it being necessary to use high frequency values, or frequency multiplication. This results in low electric power consumption, which allows an FM receiver of this type to be used for an RDS application, for example.

These objects, features and advantages of the present invention in addition to others, will appear more clearly upon reading the detailed description of a preferred embodiment of the invention, given solely by way of example, with reference to the annexed drawings, in which:

FIG. 1, which has already been cited, shows a first conventional FM receiver;

FIG. 2, which has already been cited, shows the spectral frequency distribution of the signals present in the FM receiver of FIG. 1, during an RDS application;

FIG. 3, which has already been cited, shows a second conventional FM receiver;

Figure 1:
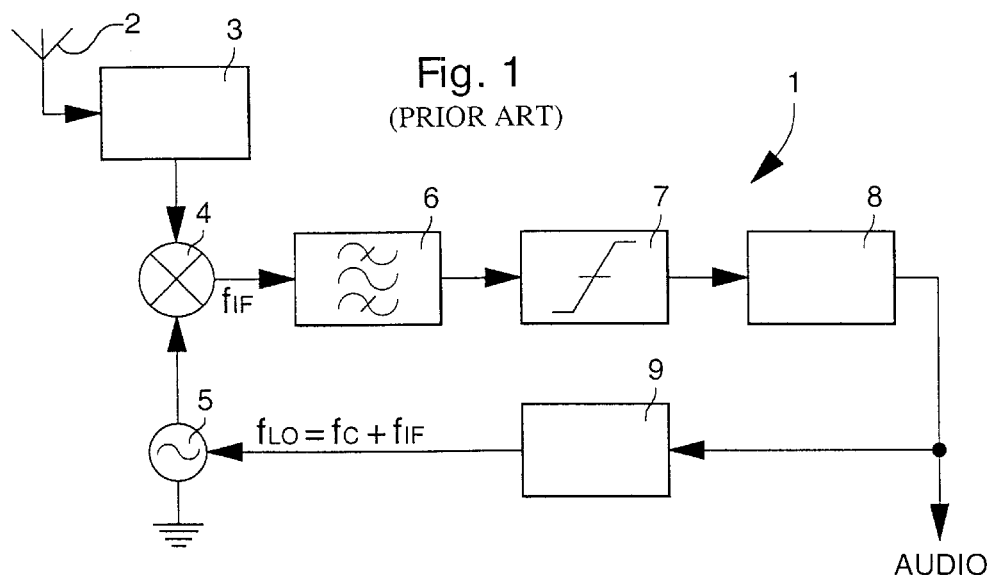
Figure 4:
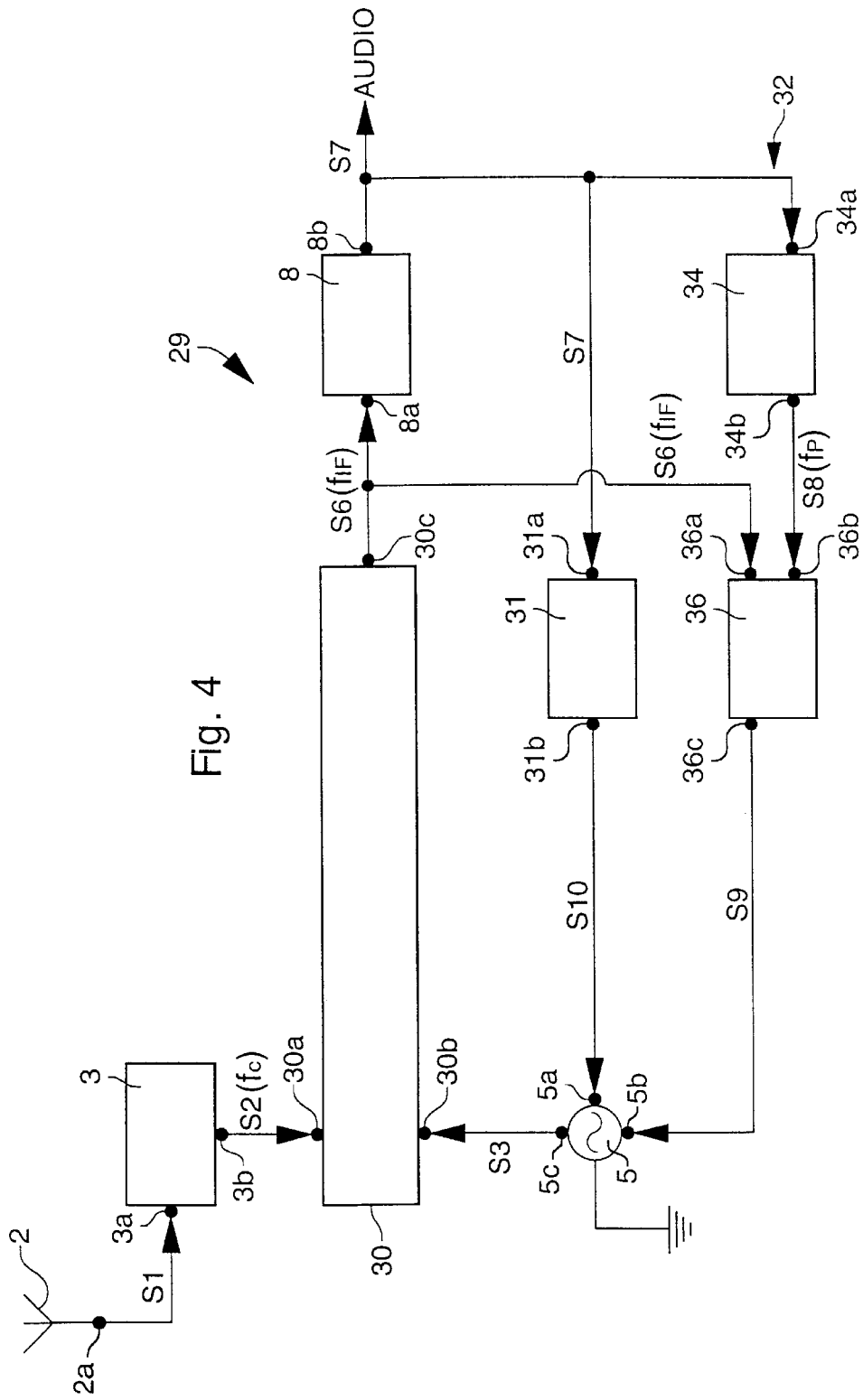
FIG. 4 shows a preferred embodiment of an FM receiver according to the present invention.

With reference to FIG. 4, a preferred embodiment of an FM receiver according to the present invention will be described. It will be noted in FIG. 4 that the reference 29 designates such a receiver, and that similar objects to those of FIG. 1 have been designated by the same references.

FM receiver 29 includes an antenna 2, a local oscillator 5, a mixer unit 30, a demodulation stage 8 and an automatic frequency control (AFC) stage 36. It will be noted that a receiver of this type is able to be made in a device requiring the supply of RDS data, for example in a timepiece such as a wristwatch.

Antenna 2 includes an output terminal 2a connected to RF stage 3. Antenna 2 is arranged to be able to receive a signal having a frequency comprised within the FM transmission band (i.e. between 88 and 108 MHz) and, in response, to supply an electrical signal S1 representative of the received signal via terminal 2a.

Local oscillator 5 includes two input terminals 5a and 5b and an output terminal 5c connected to mixer unit 30. Local oscillator 5 is arranged to provide an electric signal S3, as is described in more detail hereinafter.

Mixer unit 30 includes an input terminal 30a connected to output terminal 3b of RF stage 3, an input terminal 30b connected to output terminal 5c of local oscillator 5, and an output terminal 30c connected to demodulation stage 8. Mixer unit 30 is arranged to supply, in response to signals S2 and S3, an electric signal S6 at an intermediate frequency $f_{IF}$.

Figure 5:
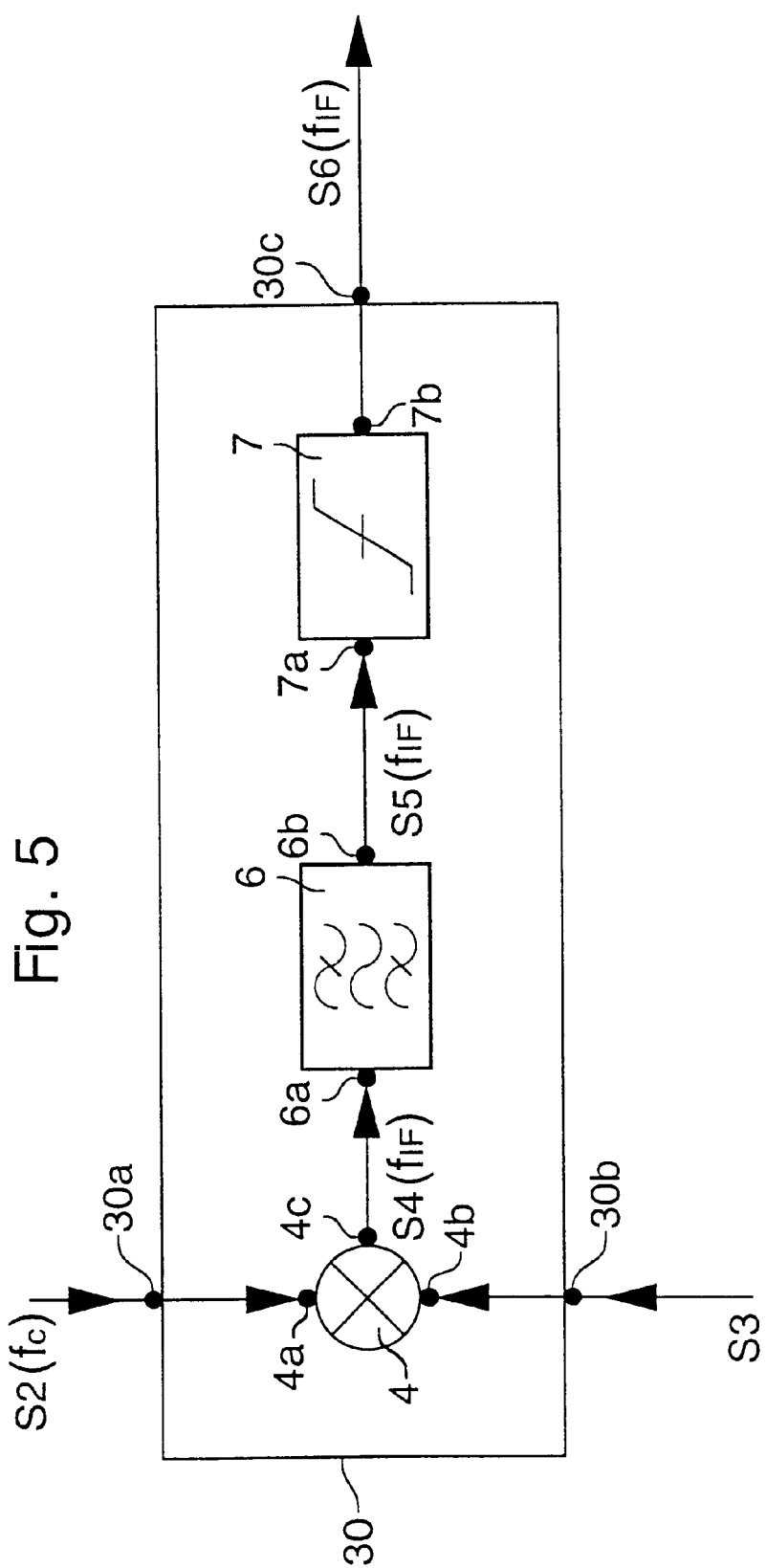
FIG. 5 shows in detail a circuit of the FM receiver of FIG. 4.

Preferably, mixer unit 30 is made by connecting in series a mixer 4, an IF filter 6 and an amplifier/limiter 7, as shown in FIG. 5.

Mixer 4 includes two input terminals 4a and 4b connected to the respective terminals 30a and 30b of mixer unit 30, and an output terminal 4c connected to IF filter 6. Mixer 4 is arranged to be able to: receive, via terminal 4a, signal S2, and via terminal 4b; electric signal S3; multiply signals S2 and S3 by each other; and supply, via terminal 4c, an electric signal S4 so that the latter is modulated at intermediate frequency $f_{IF}$. By way of example, intermediate frequency $f_{IF}$ is selected to be equal to approximately 70 kHz.

IF filter 6 includes an input terminal 6a connected to output terminal 4c of mixer 4, and an output terminal 6b connected to a amplifier/limiter 7. IF filter 6 is arranged to be able to receive, via terminal 6a, signal S4 and, in response, to supply an electric signal S5 located within a frequency band centred around intermediate frequency $f_{IF}$.

Amplifier/limiter 7 includes an input terminal 7a connected to output terminal 6b of IF filter 6, and an output terminal 7b connected to output terminal 30c of mixer unit 30. Amplifier/limiter 7 is arranged to be able to receive, via terminal 7a, signal S5, limit the amplitude of this signal to eliminate any AM component therefrom and, in response, to supply signal S6 via terminal 7b.

With reference once more to FIG. 4, FM demodulation stage 8 includes an input terminal 8a connected to output terminal 7b of amplifier/limiter 7, and an output terminal 8b connected to an audio amplifier (not shown in FIG. 4). FM demodulation stage 8 is arranged to be able to receive, via terminal 8a, signal S6, demodulate this signal and, in response, supply an electric signal S7 representing demodulated signal S6.

It is to be noted that an embodiment of demodulation stage 8 is disclosed in U.S. Pat. No. 5,808,510.

AFC stage 36 includes an input terminal 36a connected to output terminal 7b of amplifier/limiter 7, and an output terminal 36c connected to input terminal 5b of local oscillator 5. AFC stage 36 is arranged to allow fine tuning to be performed between frequency $f_{LO}$ of signal S3 of local oscillator 5, in order to keep intermediate frequency $f_{IF}$ constant, as is described in more detail hereinafter.

FM receiver 29 further includes a locked loop 32 arranged to enslave intermediate frequency $f_{IF}$ from a pilot frequency fp. It will be recalled that such a frequency is always available in an FM multiplex signal, and allows reconstitution of the carrier which is removed in a stereophonic FM receiver. Within the scope of the present description, pilot frequency fp is present in signal S7, and is typically equal to 19 kHz.

For this purpose, locked loop 32 includes a phase locked loop (PLL) filter 34 and AFC stage 36.

Filter 34 includes an input terminal 34a connected to output terminal 8b of demodulation stage 8, and an output terminal 34b connected to AFC stage 36. Filter 34 is arranged to receive, via terminal 34a, signal S7 and, in response, supply, via terminal 34b, an electric signal S8 having a substantially equal frequency to pilot frequency fp.

Filter 34 may be made from a phase locked loop (PLL) having a bandwidth determined so as to be able to supply the signal at pilot frequency fp and with a high signal to noise ratio (SNR). This allows a stable reference frequency to be provided, capable of performing the AFC function, without it being necessary to use additional means able to provide a reference frequency.

AFC stage 36 further includes an input terminal 36b connected to output terminal 34b of filter 34. AFC stage 36 is arranged to be able to receive signal S6 at intermediate frequency $f_{IF}$ and signal S8 at pilot frequency fp and, in response, provide an electric signal S9 able to control local oscillator 5 (i.e. the supply of signal S3 at frequency $f_{LO}$) so that intermediate frequency $f_{IF}$ has a mean value enslaved to a predetermined value, as is described hereinafter.

Figure 6:
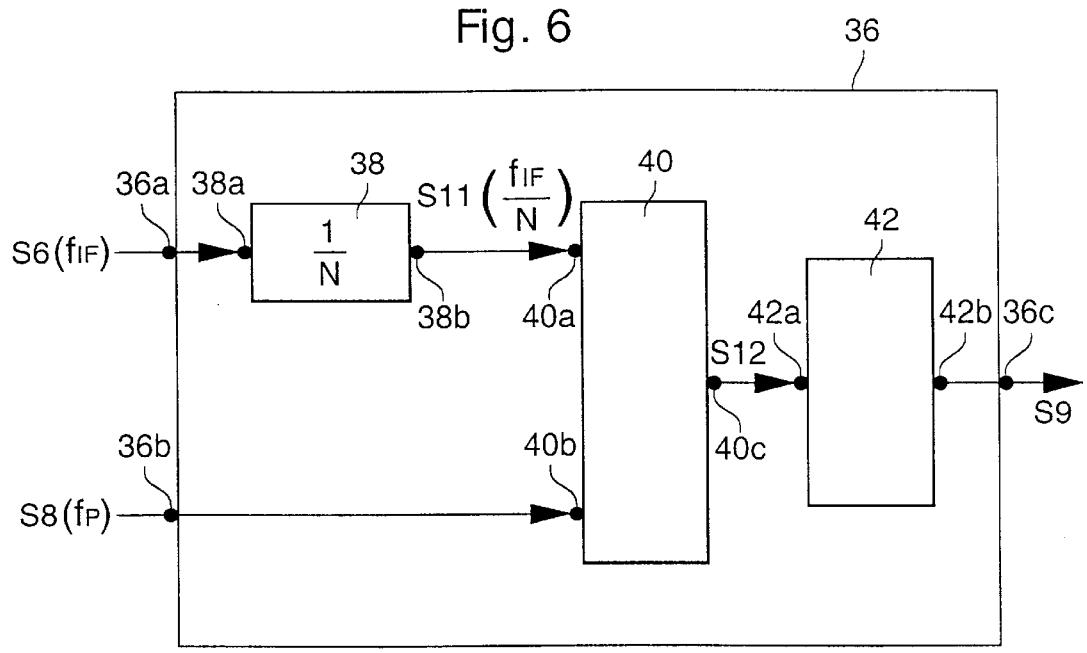
FIG. 6 shows in detail another circuit of the FM receiver of FIG. 4.

FIG. 6 shows in detail an embodiment of AFC stage 36 which includes a first frequency divider 38, a phase and frequency comparator 40 and a loop filter 42.

Divider 38 includes an input terminal 38a connected to input terminal 36a of AFC stage 36, and an output terminal 38b connected to comparator 40. Divider 38 is arranged to be able to receive, via terminal 38a, signal S6 at frequency $f_{IF}$ and, in response, supply, via terminal 38b, an electric signal S11 at a frequency equal to:$f_{IF}/N$, N being an integer number.

Comparator 40 includes an input terminal 40a connected to output terminal 38b of divider 38, an input terminal 40b connected to input terminal 36b of AFC stage 36, and an output terminal 40c connected to filter 42. Comparator 40 is arranged to be able to receive, via terminals 40a and 40b, signal S11 at frequency $f_{IF}/N$ and signal S8 at pilot frequency fp, to compare signals S11 and S8 with each other and, in response, to supply, via terminal 40c, an error signal S12 which is proportional to the frequency difference between frequencies $f_{IF}/N$ and fp.

Filter 42 includes an input terminal 42a connected to output terminal 40c of comparator 40, and an output terminal 42b connected to output terminal 36c of AFC stage 36. Filter 42 is arranged to be able to receive, via terminal 42a, signal S12 and, in response, to supply via terminal 42b, signal S9 representative of the difference between frequencies $f_{IF}/N$ and fp.

Essentially, with reference to FIGS. 4 to 6, when loop 32 is locked, intermediate frequency $f_{IF}$ then has a mean value which is substantially equal to:N·fp, this value corresponding to said predetermined value which allows the signals containing the RDS data to be decoded.

Three cases representative of three frequency ranges in which said predetermined value can be chosen so as to allow decoding of the signals containing the RDS data, will now be described, purely by way of example. These three cases will be described with reference once more to FIG. 2, and in relation to the respective FIGS. 7A to 7C which show the spectral distributions of the signals containing the RDS data and frequency $f_{IF}$ for three different predetermined values respectively.

Figure 2:
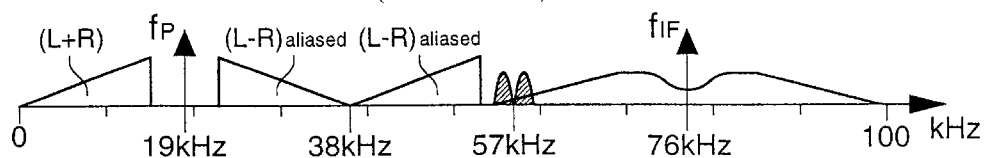
Figure 3:
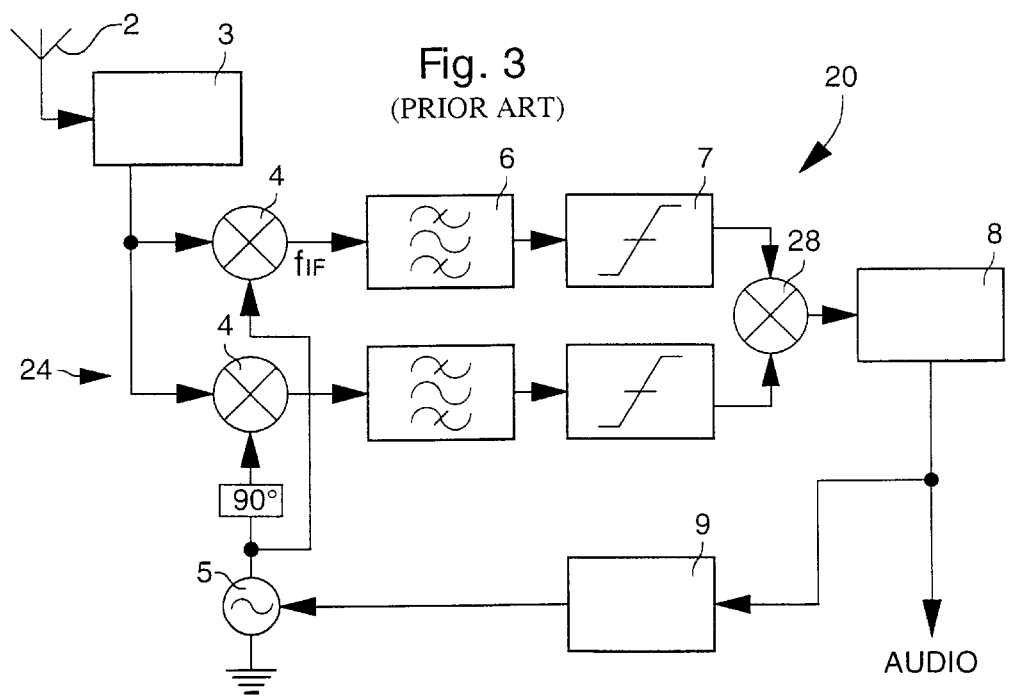
Figure 7A:
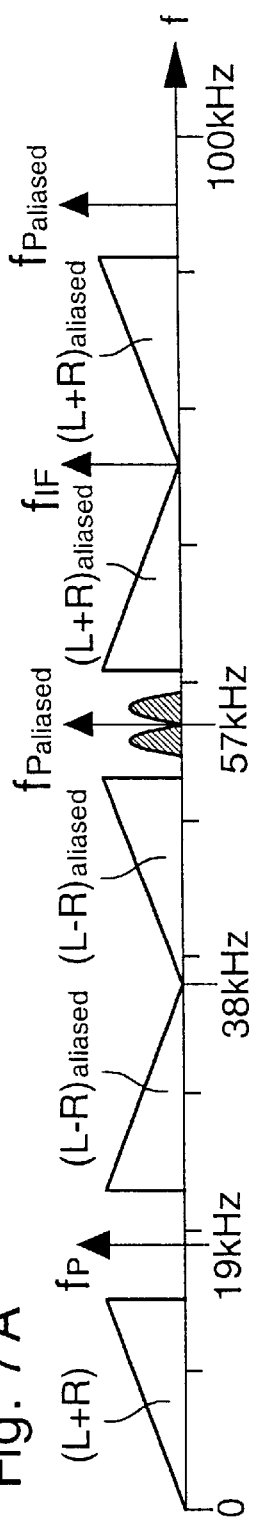
FIGS. 7A to 7C show the spectral frequency distributions of signals present in the FM receiver of FIG. 4, during an RDS application, for three different predetermined values respectively.

With reference to FIG. 7A, let us consider the first case wherein said predetermined value is chosen so that frequency $f_{IF}$ is enslaved to 76 kHz, taking the values cited in relation to FIG. 2.

Figure 7B:
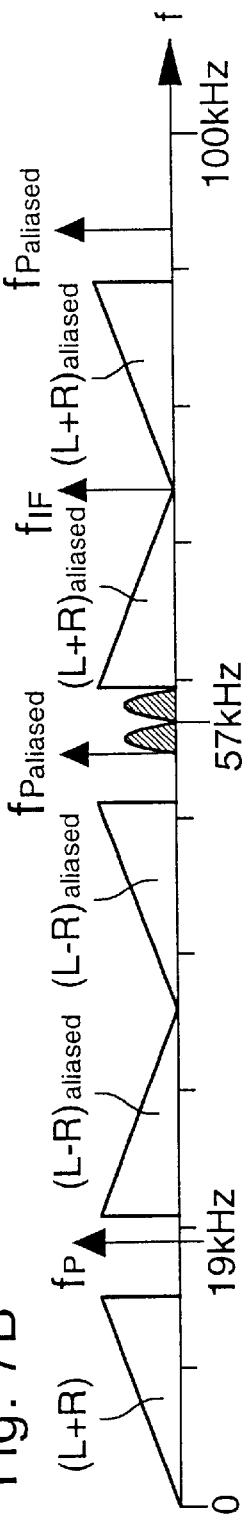

With reference to FIG. 7B, let us consider the second case wherein said predetermined value is chosen so that frequency $f_{IF}$ is comprised between 72 and 73.5 kHz, taking the value cited in relation to FIG. 2.

Figure 7C:
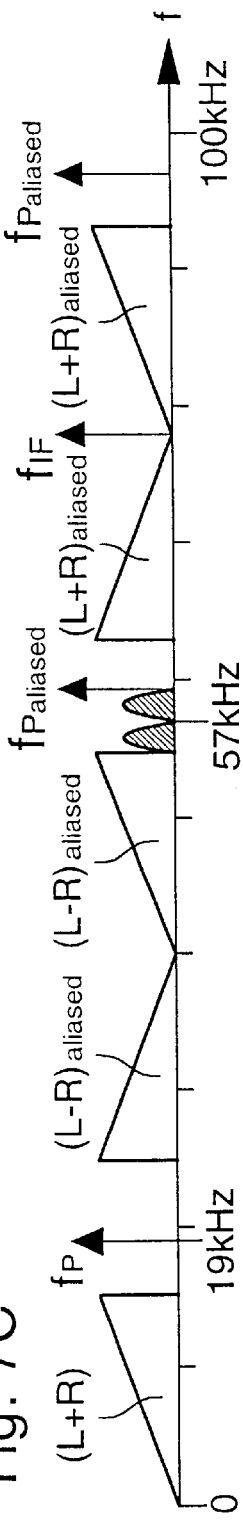

With reference to FIG. 7C, let us consider the third case wherein said predetermined value is chosen so that frequency $f_{IF}$ is comprised between 78.5 and 80 kHz, taking the values cited in relation to FIG. 2.

Thus, in the aforementioned three cases, there is no overlap between the spectral distribution of the signals containing the RDS data and those of the audio data, so that the aliasing phenomenon does not prevent demodulation of the signals containing the RDS data.

It goes without saying for those skilled in the art that the above description may undergo various modifications without departing from the scope of the present invention.

By way of improvement, and with reference once again to FIG. 4, receiver 29 may include a high frequency (RF) stage 3, including an input terminal 3a connected to output terminal 2a of antenna 2, and an output terminal 3b connected to mixer unit 30. RF stage 3 is arranged to be able to receive, via terminal 3a, signal S1 and, in response, to supply, via terminal 3b, an amplified electric signal S2 having a frequency comprised within a frequency band centred on a carrier frequency fc of a predetermined transmitter.

One advantage of such an arrangement of RF stage 3 is that it substantially increases the sensitivity of receiver 29, so that the latter can then operate with RF signals of low amplitude.

Also by way of improvement, and with reference once more to FIG. 4, receiver 29 can include a frequency locked loop (FLL) 31 including an input terminal 31a connected to output terminal 8b of demodulation stage 8, to receive signal S7, and an output terminal 31b connected to input terminal 5a of local oscillator 5, to supply a signal S10.

One advantage of such an arrangement of FLL filter 31 is that the deviation of signal S6 can be reduced.

Figure 8:
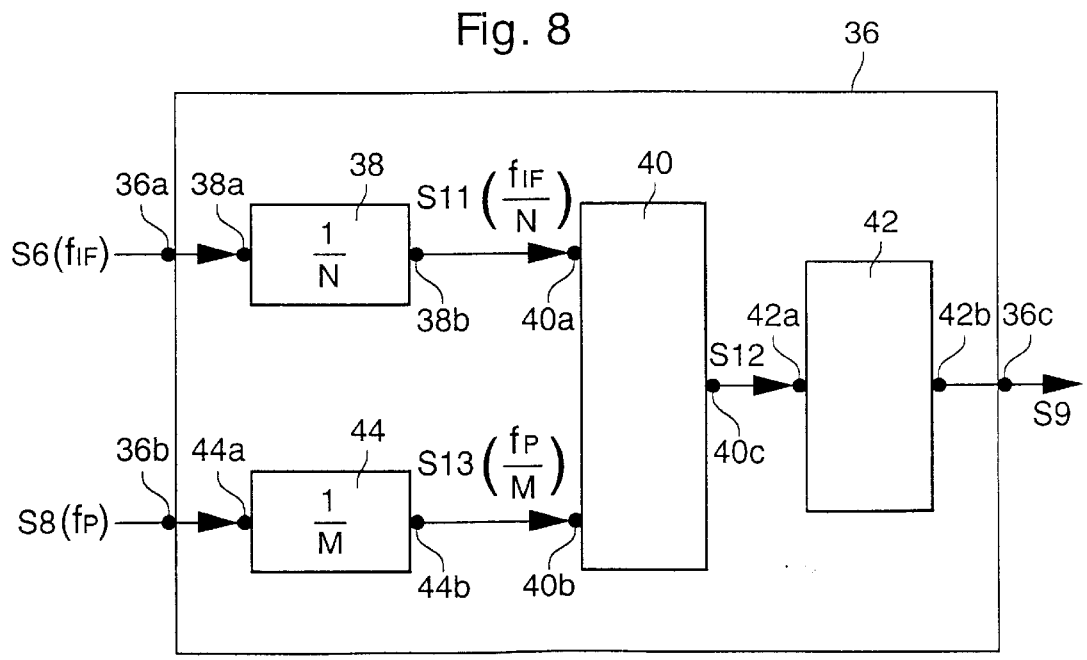
FIG. 8 shows an improvement of the circuit of FIG. 6.

Also by way of improvement, and with reference to FIG. 8, AFC stage 36 can further include a second frequency divider 44. It is to be noted in FIG. 8 that similar objects to those of FIG. 6 have been designated by the same references.

As FIG. 8 shows, divider 44 includes an input terminal 44a connected to input terminal 36b of AFC stage 36, and an output terminal 44b connected to input terminal 40b of comparator 40. Divider 44 is arranged to be able to receive, via terminal 44a, signal S8 at pilot frequency fp and, in response, to supply via terminal 44b, an electric signal S13 at a frequency equal to: fp/M, M being an integer number.

Essentially, and with reference to FIGS. 4 and 8, when loop 32 is locked, intermediate frequency $f_{IF}$ then has a mean value which is substantially equal to N/M·fp.

One advantage of such an arrangement of divider 44 is that the resolution of locked loop 32 is increased. By way of example, in the event that M=19, intermediate frequency $f_{IF}$ may then be adjusted by steps of 1 kHz.

What is claimed is:

1. An FM receiver able to receive a high frequency signal from a transmitter, said receiver including:

an antenna for receiving said high frequency signal and providing a first electric signal representative of said received signal;

a high frequency stage for providing a second electric signal amplified with respect to said first signal and at a frequency comprised within a frequency band centred on a carrier frequency of said transmitter;

an oscillator for providing, in response to a control signal, a third electric signal;

a mixer unit for providing the product of said second and third signals in the form of a fourth electric signal at an intermediate frequency; and an FM demodulation stage for demodulating said fourth signal and providing the result in the form of a fifth electric signal;

wherein said receiver further includes a locked loop arranged to enslave said intermediate frequency from a pilot frequency present in said fifth signal, said locked loop including an automatic frequency control stage for providing said control signal to said oscillator in response to a comparison between said intermediate frequency of the fourth signal and said pilot frequency present in said fifth signal, so as to keep the intermediate frequency of said fourth signal constant.

2. The receiver according to claim 1, wherein said locked loop further includes:

a phase locked loop filter for providing a sixth electric signal at said pilot frequency in response to said fifth signal;

said automatic frequency control stage providing said control signal in response to said fourth signal at said intermediate frequency and to said sixth signal at said pilot frequency, so that said intermediate frequency has a mean value enslaved to a predetermined value depending on said pilot frequency.

3. The receiver according to claim 2, wherein said phase locked loop filter is formed so as to have a determined bandwidth, so as to be able to provide said sixth signal at said pilot frequency and with a high signal to noise ratio.

4. The receiver according to claim 2, wherein said automatic frequency control stage includes:

a first frequency divider for providing, in response to said fourth signal at said intermediate frequency, a seventh electric signal at a first frequency equal to said intermediate frequency divided by a first integer number;

a phase and frequency comparator for providing, in response to said seventh signal at said first frequency and to said sixth signal at said pilot frequency, an eighth electric signal representative of the difference between said first frequency and said pilot frequency; and a loop filter for providing, in response to said eighth signal, said control signal representative of the difference between said first frequency and said pilot frequency, so that said intermediate frequency has a mean value enslaved to a predetermined value equal to the product of said pilot frequency and said first integer number.

5. The receiver according to claim 2, wherein said automatic frequency control stage includes:

a first frequency divider for providing, in response to said fourth signal at said intermediate frequency, a seventh electric signal at a first frequency equal to said intermediate frequency divided by a first integer number;

a second frequency divider for providing, in response to said sixth signal at said pilot frequency, a ninth electric signal at a second frequency equal to said pilot frequency divided by a second integer number;

a phase and frequency comparator for providing, in response to said seventh signal at said first frequency and to said ninth signal at said second frequency, an eighth electric signal representative of the difference between said first and second frequencies; and a loop filter for providing, in response to said eighth signal, said control signal representative of the difference between said first and second frequencies, so that said intermediate frequency has a mean value enslaved to a predetermined value equal to the product of said pilot frequency and said first integer number divided by said second integer number.

6. The receiver according to claim 1, wherein said locked loop further includes a frequency locked loop filter arranged to receive said fifth signal and to provide in response a tenth electric signal to said oscillator, so as to reduce deviation of said fourth signal.

7. The receiver according to claim 1, wherein said mixer unit includes, connected in series, a mixer, an intermediate frequency filter and an amplifier/limiter.

8. The receiver according to claim 1, wherein said pilot frequency is equal to 19 kHz.

* * * * *